United States Patent
Luan et al.

(10) Patent No.: US 10,038,108 B2
(45) Date of Patent: Jul. 31, 2018

(54) GLUE BLEEDING PREVENTION CAP FOR OPTICAL SENSOR PACKAGES

(71) Applicant: STMICROELECTRONICS PTE LTD, Singapore (SG)

(72) Inventors: Jing-En Luan, Shenzhen (CN); Laurent Herard, Singapore (SG); Yong Jiang Lei, Shenzhen (CN)

(73) Assignee: STMicroelectronics Pte Ltd, Singapore (SG)

( * ) Notice: Subject to any disclaimer, the term of this patent is extended or adjusted under 35 U.S.C. 154(b) by 0 days.

(21) Appl. No.: 15/340,216

(22) Filed: Nov. 1, 2016

(65) Prior Publication Data

US 2018/0062003 A1 Mar. 1, 2018

(30) Foreign Application Priority Data

Aug. 26, 2016 (CN) .......................... 2016 1 0728139

(51) Int. Cl.
| | |
|---|---|
| *H01L 31/12* | (2006.01) |
| *G06M 7/00* | (2006.01) |
| *H01L 31/0203* | (2014.01) |
| *H01L 31/18* | (2006.01) |
| *G01S 7/481* | (2006.01) |
| *H01L 31/153* | (2006.01) |
| *H01L 25/00* | (2006.01) |

(52) U.S. Cl.
CPC .......... *H01L 31/0203* (2013.01); *G01S 7/481* (2013.01); *H01L 31/125* (2013.01); *H01L 31/153* (2013.01); *H01L 31/18* (2013.01); *H01L 25/50* (2013.01)

(58) Field of Classification Search
CPC ..... H01L 31/153; H01L 31/125; H01L 25/50; G01S 7/481
USPC ...................................... 257/81, 82; 250/221
See application file for complete search history.

(56) References Cited

U.S. PATENT DOCUMENTS

| | | | |
|---|---|---|---|
| 2011/0204233 A1* | 8/2011 | Costello ................ | G01S 7/4813 250/338.4 |
| 2012/0160994 A1* | 6/2012 | Costello ............... | G01D 11/245 250/221 |
| 2014/0191253 A1* | 7/2014 | Haslbeck ............ | H01L 31/0203 257/82 |

(Continued)

*Primary Examiner* — David Vu
*Assistant Examiner* — Brandon Fox
(74) *Attorney, Agent, or Firm* — Seed IP Law Group LLP

(57) ABSTRACT

One or more embodiments are directed to system in package (SiP) for optical devices, such as proximity sensing or optical ranging devices. One embodiment is directed to an optical sensor package that includes a substrate, a sensor die coupled to the substrate, a light-emitting device coupled to the substrate, and a cap. The cap is positioned around side surfaces of the sensor die and covers at least a portion of the substrate. The cap includes first and second sidewalls, an inner wall having first and second side surfaces and a mounting surface, and a cover in contact with the first and second sidewalls and the inner wall. The first and second side surfaces are transverse to the mounting surface, and the inner wall includes an opening extending into the inner wall from the mounting surface. A first adhesive material is provided on the sensor die and at least partially within the opening, and secures the inner wall to the sensor die.

23 Claims, 8 Drawing Sheets

(56) References Cited

U.S. PATENT DOCUMENTS

2015/0226839 A1* 8/2015 Brandl .................. H01L 25/167
                                                            250/221
2017/0047455 A1* 2/2017 Yiu ........................ H01L 33/46

* cited by examiner

GLUE BLEEDING PREVENTION CAP FOR OPTICAL SENSOR PACKAGES

BACKGROUND

Technical Field

Embodiments of the present disclosure are directed to optical sensor packages, and more particularly, to optical sensor packages having a cap that contains a flow or otherwise prevents bleeding of an adhesive material.

Description of the Related Art

Optical sensors, such as proximity sensors, are used to detect the presence of nearby objects and are able to do so without physically touching the object. Proximity sensors may be utilized in various electronic devices, such as cameras, phones, including smartphones, vehicles, machinery, and other devices that may want to detect the presence of nearby objects. After detecting the presence of the nearby object, the electronic device may be configured to perform a function, such as move a mechanical feature to a secure position, couple or uncouple an electrical communication, or any other desired function.

Proximity sensors typically include a light-emitting device, such as a light-emitting diode (LED), and a light-receiving sensor, such as a photodiode. The LED and photodiode are packaged together in a sensor package. Generally described, the LED emits radiation out a first opening in the sensor package. If an object is close to the sensor package, a suitable amount of the emitted radiation is reflected off of the object and back toward the sensor package. Some of the reflected radiation enters a second opening in the sensor package proximate the photodiode. The photodiode receives the reflected radiation and generates an electrical signal indicative of the received radiation.

The sensor package is typically in electrical communication with an image sensor processor. The image sensor processor causes the LED to emit the radiation and to receive the electrical signal from the photodiode indicative of the reflected radiation received. Typically, the image sensor processor is enclosed in its own package and both the sensor package and image sensor processor package are coupled to a board, such as a circuit board, and electrically coupled to each other through the board.

Additionally, a cap is typically included in the proximity sensor package. The cap includes an opening for transmitting the emitted radiation, as well as an opening for receiving the reflected radiation. Air vents may be included in the cap for venting air from within the sensor package to the outside environment, particularly during thermal processes such as attaching the cap to the image sensor processor and the board. The cap is attached to the substrate and the image sensor processor by an adhesive material, such as glue. However, a problem of glue bleeding may occur during staging and/or curing of the glue, in which the glue flows up an inner wall of the cap and may block the air vents and further may obscure the openings for emitting or receiving light.

BRIEF SUMMARY

One or more embodiments are directed to a system in package (SiP) for optical devices, such as proximity sensing or ranging devices. One embodiment is directed to an optical sensor package that includes a substrate, a sensor die coupled to the substrate, a light-emitting device coupled to the substrate, and a cap. The cap is positioned around side surfaces of the sensor die and covers at least a portion of the substrate. The cap includes first and second sidewalls, an inner wall having first and second side surfaces and a mounting surface, and a cover in contact with the first and second sidewalls and the inner wall. The first and second side surfaces are transverse to the mounting surface, and the inner wall includes an opening extending into the inner wall from the mounting surface. An adhesive material, such as glue, is provided on the sensor die and at least partially within the opening, and secures the inner wall to the sensor die.

In particular, the cap allows the adhesive material to flow into the opening formed in the inner wall of the cap, thereby preventing bleeding of the adhesive material up sidewalls of the cap, which can obscure a light-emitting or light-receiving opening of the optical sensor package. Additionally, such bleeding (which is prevented by the caps and optical sensor packages provided herein) can cause blockage of one or more air vents formed in the cap.

In one or more embodiments, the cap can be attached to the substrate and/or sensor die by filling the opening in the inner wall with the adhesive material. For example, in an embodiment, the opening may include a slot formed completely through the inner wall and the cover of the cap. The adhesive material may then be applied in the slot, through the cover and onto the sensor die. In other embodiments, the opening in the cap may be formed only partially through the inner wall, in which case the adhesive material may be applied on a surface of the sensor die, and the inner wall of the cap may be positioned onto the adhesive material. The opening thus may accommodate a flow of the adhesive material, thereby preventing bleeding up the side surfaces of the inner wall.

DETAILED DESCRIPTION

Figure 1:
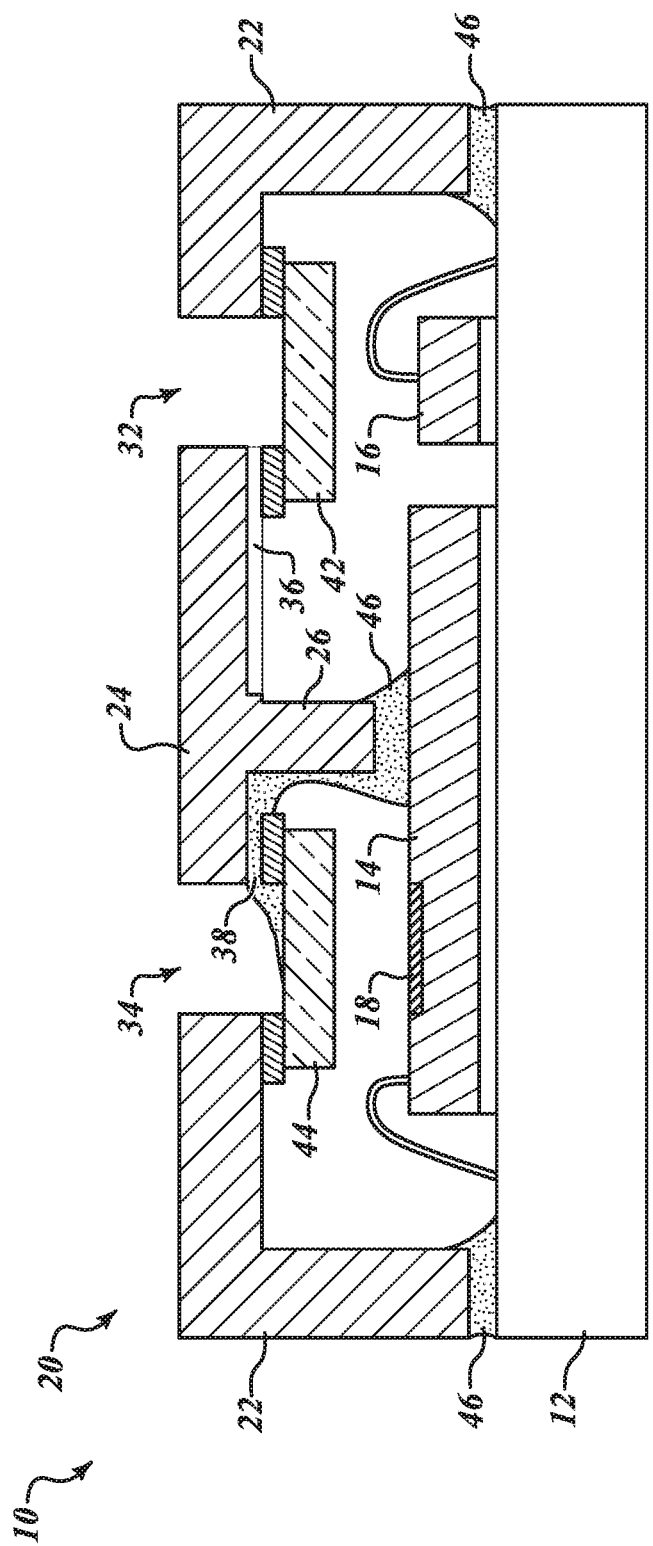
FIG. 1 is a cross-sectional view of an optical sensor package in which a problem of glue bleeding occurs.

FIG. 1 illustrates an optical sensor package 10, as may be known in the art. The optical sensor package 10 includes a sensor die 14 secured to a substrate 12. A light-emitting device 16 is secured to the substrate 12. The optical sensor package 10 further includes a cap 20 that includes sidewalls 22, a cover 24 and an inner wall 26. The cap 20 includes first and second openings 32, 34 through which light emitted by the light-emitting device 16 is transmitted (e.g., through the first opening 32) and light reflected by an object is received (e.g., through the second opening 34) by a sensor region 18 formed in the sensor die 14.

First and second transparent windows 42, 44 are attached to the cap 20 (e.g., to a lower surface of the cover 24, as shown) and first and second air vents 36, 38 are formed between the first and second openings 32, 34 and the first and second transparent windows 42, 44, respectively. The cap 20 is attached to the substrate 12 (e.g., the sidewalls 22 are attached to the substrate 12) and to the sensor die 14 (e.g., the inner wall 26 is attached to the sensor die 14), as shown. The cap 20 is secured by an adhesive material, such as glue 46.

As shown in FIG. 1, during or after the process of attaching the cap 20 to the substrate 12 and sensor die 14, glue 46 can bleed from the inner wall 26 (e.g., from a lower surface or side surfaces of the inner wall 26), over the side surfaces of the inner wall 26 and into and/or through either or both of the air vents 36, 38, thereby blocking the air vents 36, 38 and preventing or otherwise impeding the flow of air through the air vents 36, 38. This may occur, for example, during staging and/or curing of the glue 46. Additionally, as shown in FIG. 1, the glue 46 may partially or fully obscure one or both of the first and second openings 32, 34.

Figure 2A:
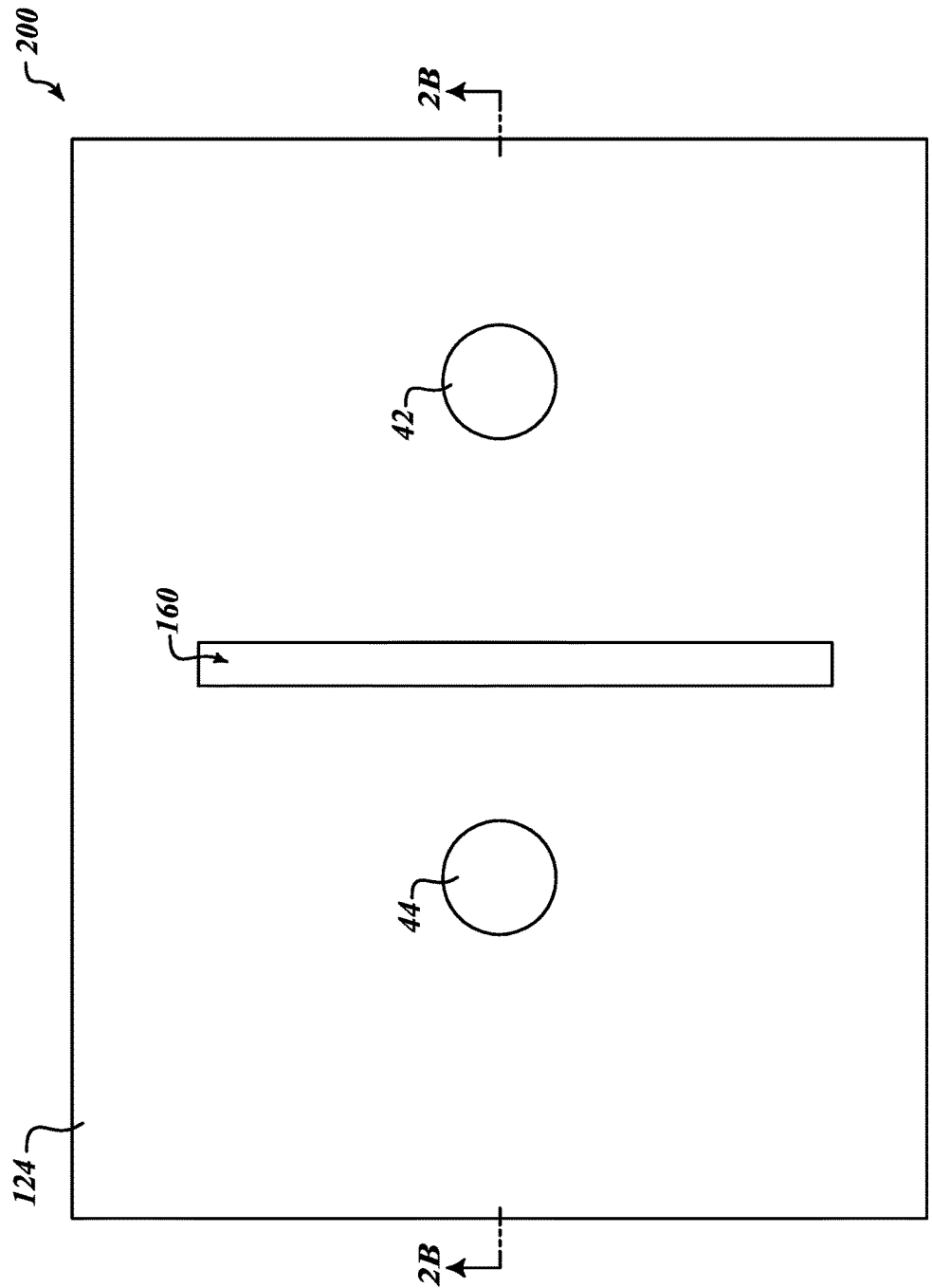
FIG. 2A is a top view of an optical sensor package including a cap, in accordance with an embodiment of the present disclosure.
Figure 2B:
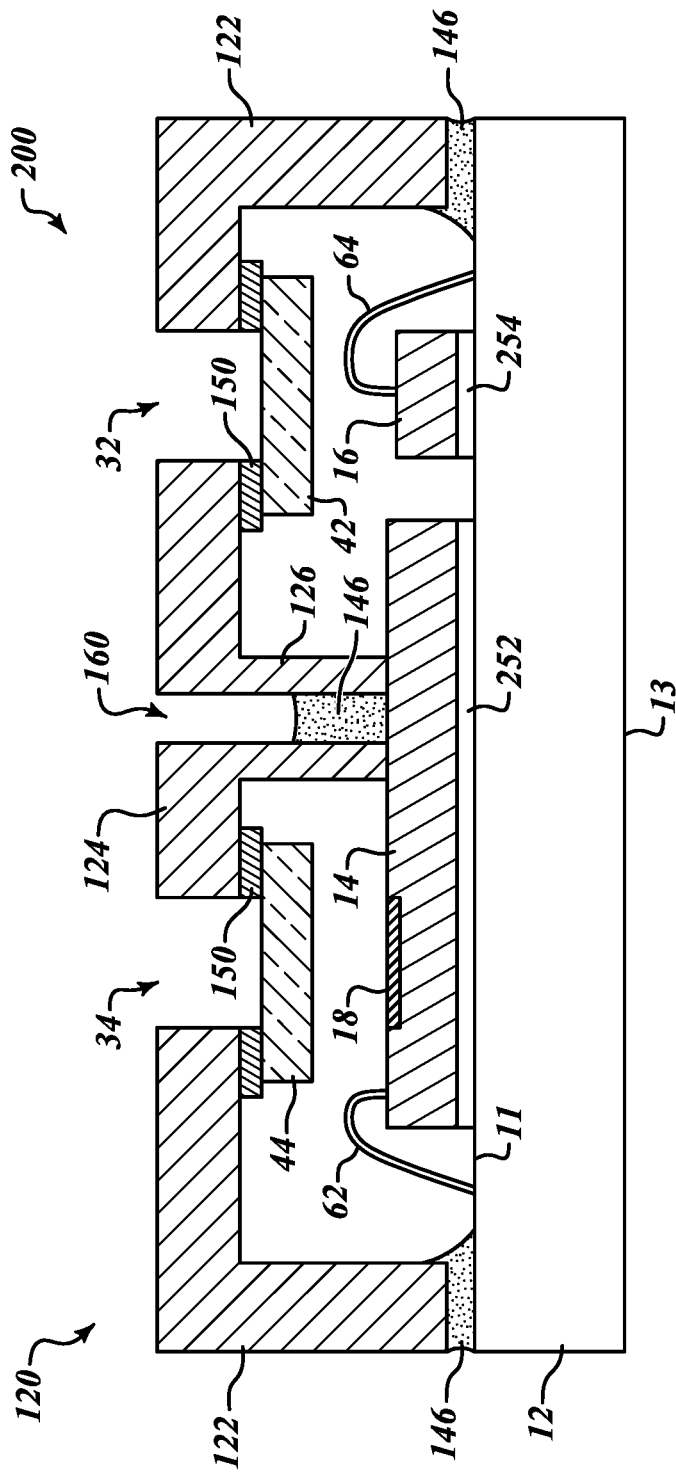
FIG. 2B is a cross-sectional view of the optical sensor package shown in FIG. 2A.

FIG. 2A is a top view of an optical sensor package 200 including a cap 120, and FIG. 2B is a cross-sectional view of the optical sensor package 200 of FIG. 2A, taken along the line 2B, in accordance with one or more embodiments provided by the present disclosure. The optical sensor package 200 of FIGS. 2A and 2B is similar in structure and in function to the optical package 10 shown in FIG. 1; however, the cap 120 of the optical sensor package 200 is different, and reduces or eliminates the glue bleeding problems associated with the cap 20 of the optical package 10 of FIG. 1.

As can be seen from FIGS. 2A and 2B, the cap 120 includes sidewalls 122, a cover 124 and an inner wall 126. The cap 120 further includes first and second openings 32, 34 for transmitting light emitted by the light-emitting device 16 (e.g., through the first opening 32) and for receiving light reflected by an object (e.g., through the second opening 34).

First and second transparent windows 42, 44 are attached to the cap 120 (e.g., to a lower surface of the cover 124, as shown) by an adhesive material 150, which may be any material configured to securely attach the first and second transparent windows 42, 44 to the cap 120. The adhesive material 150 may be glue in one or more embodiments. In other embodiments, the adhesive material 150 may be any adhesive material, such as a paste, epoxy, film, tape or the like. As shown in FIG. 2B, the first and second transparent windows 42, 44 may be attached to a lower surface of the cover 124 of the cap (i.e., the portion of the cap 120 that extends horizontally between the inner wall 126 and the sidewalls 122).

In one or more embodiments, and in contrast to the cap 20 shown in FIG. 1, the cap 120 may be formed without having air vents between the transparent windows 42, 44 and the cover 124. Accordingly, the height of the cap 120 may be reduced as compared to the cap 20 shown in FIG. 1.

The inner wall 126 of the cap 120 includes a slot 160. As shown in FIG. 2B, the slot 160 may be formed completely through the inner wall 126 (i.e., from an upper surface of the cover 124 through to a lower or mounting surface of the inner wall 126). However, in one or more embodiments, the slot 160 may be formed only partially within the inner wall 126. For example, the slot 160 may have an opening at a lower surface of the inner wall 126 and may extend upward into the inner wall 126 to a level that is below the upper surface of the inner wall 126.

As can be seen in the top view of FIG. 2A, the slot 160 may have an opening that extends across an upper surface of the cover 124 of the cap 120. The slot 160 may have various shapes and/or sizes. For example, in one or more embodiments, the slot 160 may be one or more through-holes formed through a central portion of the inner wall 126 of the cap 120. The slot 160 may be formed by any method for forming a slot or through-hole in the inner wall 126, for example, by etching, punching, drilling, or the like, through the inner wall 126 of the cap 120.

As shown in FIG. 2B, the optical sensor package 200 includes a sensor die 14 secured to an upper surface of a substrate 12. Generally described, the substrate 12 includes one or more insulative and conductive layers. A first surface 11 (e.g., the upper surface) of the substrate 12 includes pads (not shown) and a second surface 13 (e.g., the lower surface) of the substrate 12 includes pads or lands (not shown). The pads on the first surface 11 are in electrical communication with one or more pads on the second surface 13 by conductive traces and/or vias formed in the substrate 12. The second surface 13 of the substrate 12 forms an outer surface of the optical sensor package 200 and the lands on the second surface 13 are for electrically coupling the optical sensor package 200 to another device or board (not shown).

The sensor die 14 is secured to the first surface 11 of the substrate 12 by an adhesive material 252. The adhesive material 252 may be any material configured to hold the sensor die 14 in place during assembly processing. For instance, the adhesive material 252 may be tape, paste, glue, or any other suitable material. In one or more embodiments, the adhesive material 252 is a die attach film.

The sensor die 14 is made from a semiconductor material, such as silicon. The sensor die 14 includes an active surface that includes one or more electrical components, such as integrated circuits. The integrated circuits may be analog or digital circuits implemented as active devices, passive devices, conductive layers, and dielectric layers formed within the die and electrically interconnected according to the electrical design and function of the die. In particular, the sensor die 14 includes electrical components that form an Application Specific Integrated Circuit (ASIC). Thus, the sensor die 14 includes circuitry to send, receive, and analyze electrical signals as is well known in the art. In the illustrated embodiment, the active surface is at the upper portion of the sensor die 14. An upper surface of the sensor die 14 includes pads for electrically coupling the sensor die to the substrate 12.

A light-emitting device 16 is secured to the first surface 11 of the substrate 12, as shown. In alternative embodiments, the light-emitting device 16 may be positioned on the sensor die 14. The light-emitting device 16 may be secured to the first surface 11 of the substrate 12 by an adhesive material 254. The adhesive material 254 may be any material suitable for securing the light-emitting device 16 to the upper surface of the sensor die 14, such as tape, paste, glue, die attach film, or any other suitable material.

The light-emitting device 16 is configured to emit radiation at a particular frequency or frequency range. In one embodiment, the light-emitting device 16 emits infrared (IR) radiation. The light-emitting device 16 may be a vertical-cavity surface-emitting laser (VCSEL) or a light-emitting diode (LED), e.g., an infrared LED.

The light-emitting device 16 is electrically coupled to the sensor die 14 (e.g., directly electrically coupled to the sensor die 14 and/or indirectly coupled to the sensor die 14 through the substrate 12 as shown in the embodiment of FIG. 2B) and configured to receive electrical signals, such as a power signal from the sensor die 14, and in response to receiving the signal, to emit the radiation at a particular frequency or frequency range. In particular, the sensor die 14 is electrically coupled to the substrate 12 by one or more conductive connectors, which in the illustrated embodiment are conductive wires 62. In that regard, a first end of a conductive wire 62 is coupled to a bond pad on the sensor die 14 and a second end of the conductive wire 62 is coupled to a pad on the first surface 11 of the substrate 12. Similarly, the light-emitting device 16 is electrically coupled to the first surface 11 of the substrate 12 by one or more conductive wires 64. For example, a first end of a conductive wire 64 may be coupled to a bond pad on the light-emitting device 16 and a second end of the conductive wire 64 may be coupled to a pad on the first surface 11 of the substrate 12. In this manner, the light-emitting device 16 may be in electrical communication with the sensor die 14 through the substrate 12.

In another embodiment, the conductive connectors are conductive bumps such that the sensor die 14 and/or light-emitting device 16 are coupled to the substrate 12 by flip chip configuration as is well known in the art.

The sensor die 14 includes a sensor region 18, which is formed in or otherwise coupled to the upper surface of the sensor die 14. The light-emitting device 16 emits radiation in response to an electrical signal received from the sensor die 14, and the sensor region 18 receives the reflected radiation and provides electrical signals to the sensor die 14 for processing. In one or more embodiments, the sensor region 18 may be or include an array of light sensing elements, such as an array of photodiodes, an array of single-photon avalanche diodes (SPADs) or the like configured to detect the reflected radiation.

The sidewalls 122 of the cap 120 are secured to the first surface 11 of the substrate 12, and the inner wall 126 of the cap 120 is secured to the upper surface of the sensor die 14 between the light-emitting device 16 and the sensor region 18. The cap 120 is secured by an adhesive material 146, which may be any adhesive material and may be different from or the same as those described above. In one embodiment, the adhesive material 146 is made from an adhesive material that is configured to form a light barrier, such as a black adhesive. In one or more embodiments, the adhesive material 146 is a flowable adhesive material.

The inner wall 126 of the cap 120 forms a light barrier between the light-emitting device 16 and the sensor region 18. That is, the inner wall 126 of the cap 120 prevents light emitted from the light-emitting device 16 from being received by the sensor region 18 through the inner wall 126. Instead, the sensor region 18 is optically isolated by the cap 120, except for light that is received through the second opening 34.

The cap 120 may be formed of any rigid or semi-rigid material, such as a plastic material. In one embodiment, the cap 120 is formed from liquid crystal plastic.

In operation, the sensor die 14 is configured to cause the light-emitting device 16 to emit light through the first opening 32. The emitted light is reflected by a nearby object and travels through the second opening 34 and the sensor region 18 receives the reflected light. The sensor die 14 receives the signals from the sensor region 18 and is configured to process signals generated by the sensor region 18 upon receiving the reflected light.

Figure 3A:
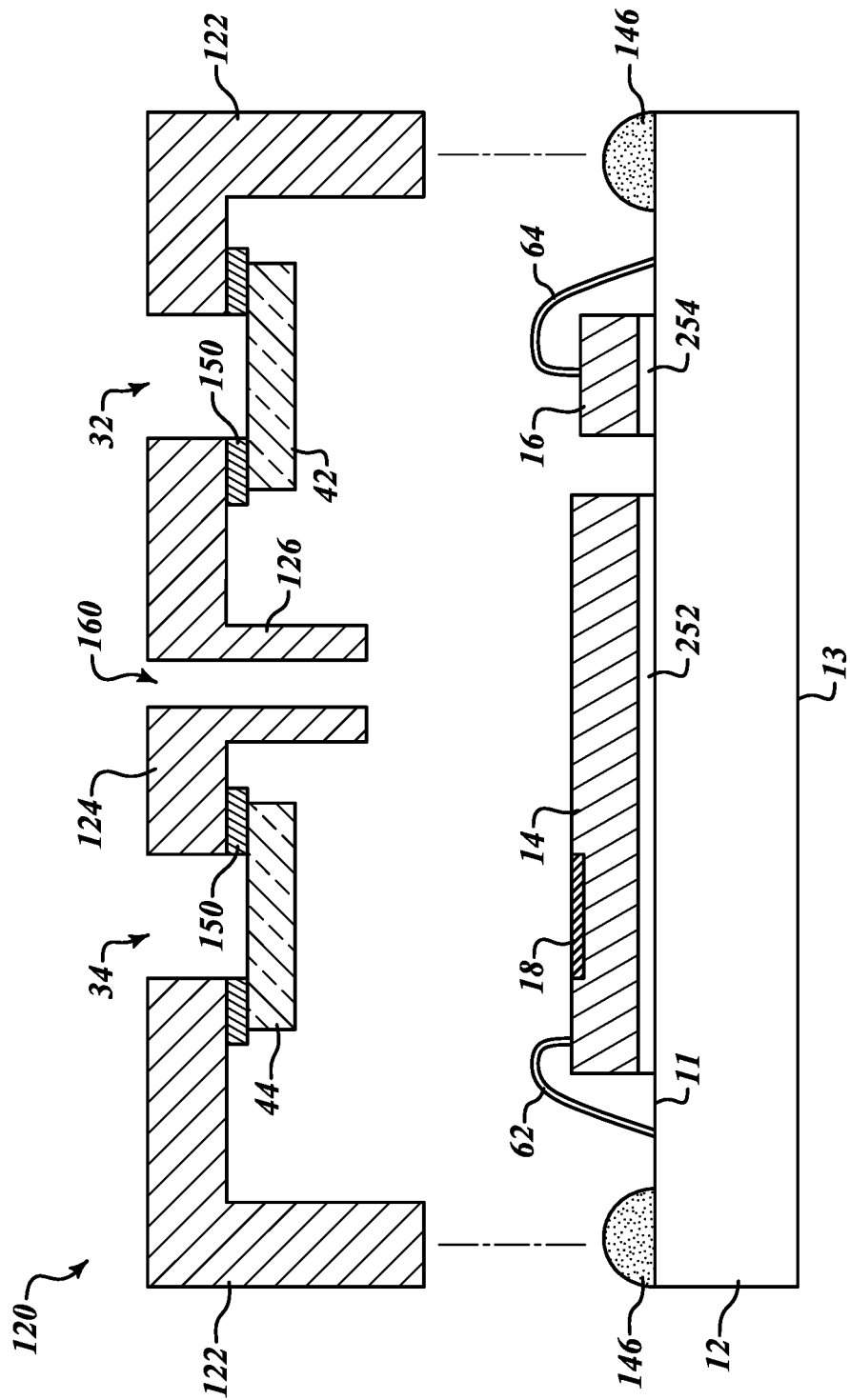
FIGS. 3A through 3C are cross-sectional views illustrating a method of forming the optical sensor package shown in FIGS. 2A and 2B, in accordance with embodiments of the present disclosure.
Figure 3B:
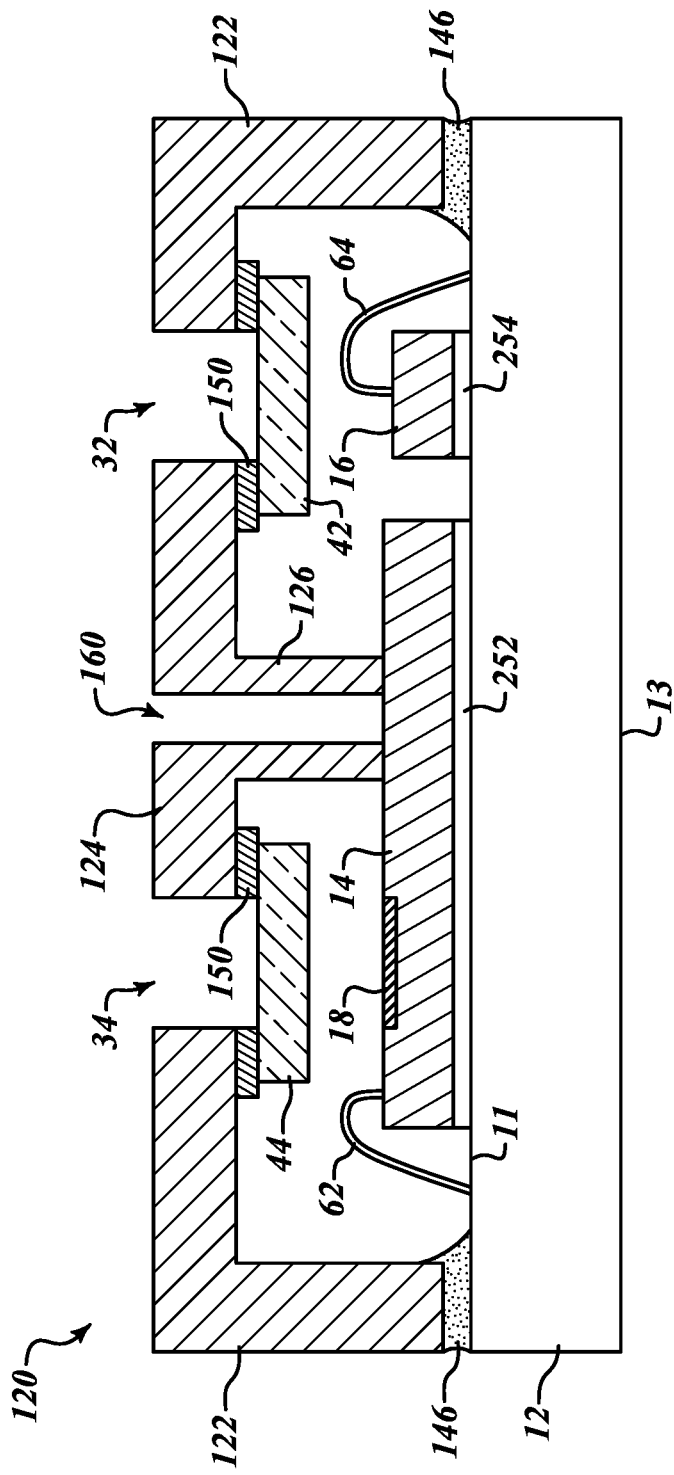
Figure 3C:
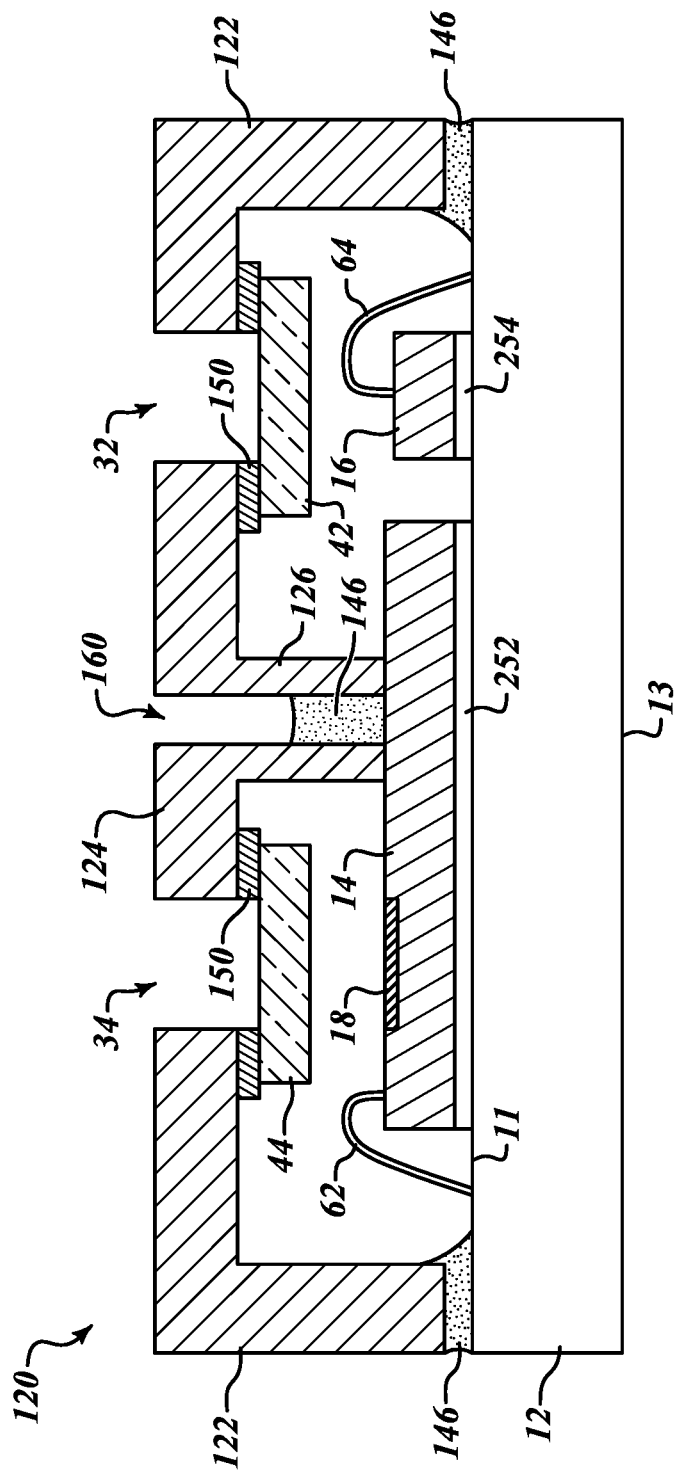

FIGS. 3A-3C illustrate various different steps for methods of making the optical sensor package 200 of FIGS. 2A and 2B, according to various embodiments. As shown in FIG. 3A, a cap 120 is provided, which may be the cap 120 including a slot 160 as shown in FIG. 2B. Similarly, the substrate 12 is provided, with the sensor die 14 and light-emitting device 16 attached to the first surface 11 of the substrate 12 by adhesive materials 252, 254, respectively. As described above, the sensor die 14 and light-emitting device 16 are electrically coupled to the substrate 12 by conductive wires 62, 64, respectively.

An adhesive material 146 is applied to the first surface 11 of the substrate 12 at positions outside of the sensor die 14 and the light-emitting device 16. Alternatively, the adhesive material 146 may be applied to lower surfaces of the sidewalls 122 of the cap 120. The cap 120 is positioned such that the sidewalls 122 are directly above the adhesive material 146, and the inner wall 126, including the slot 160, is positioned above an upper surface of the sensor die 14.

As shown in FIG. 3B, the cap 120 is lowered onto the substrate 12 such that the lower surfaces of the sidewalls 122 are brought into contact with the adhesive material 146 on the substrate 12. Downward pressure may be applied to the cap 120 to position the cap 120 as desired on the substrate 12.

As shown in FIG. 3C, after the cap 120 has been attached to the substrate 12 (i.e., by the adhesive material 146 attaching the sidewalls 122 of the cap 120 to the substrate 12), the slot 160 may be filled, fully or partially, with adhesive material 146, such as glue. The slot 160 may be filled by applying the adhesive material 146 through the slot 160 onto the upper surface of the sensor die 14 until a suitable amount of adhesive material 146 fills the slot 160. The adhesive material 146 may then be left to cure, thereby securely attaching the cap 120 to the substrate 12 and sensor die 14.

As noted above with respect to FIGS. 2A and 2B, the slot 160 may be formed only partially within the inner wall 126. For example, the slot 160 may have an opening at a lower surface of the inner wall 126 and may extend upward into the inner wall 126 to a level that is below the upper surface of the inner wall 126. In such a case, a method for forming an optical sensor package having such a cap is similar to that shown in FIGS. 3A-3C; however, instead of filling the slot 160 with adhesive material 146 through an opening at the top of the cap, adhesive material 146 may be applied to the upper surface of the sensor die 14, as well as the substrate 12 (e.g., for attaching the sidewalls 122 to the substrate 12, as described above). Then, the cap may be pressed onto the adhesive material 146 in a single step, and the adhesive material 146 applied to the upper surface of the sensor die 14 may be pushed into the slot 160 formed in the inner wall 126. Accordingly, the adhesive material 146 may move upward through the slot 160, instead of bleeding over outer surfaces of the inner wall 126.

Figure 4:
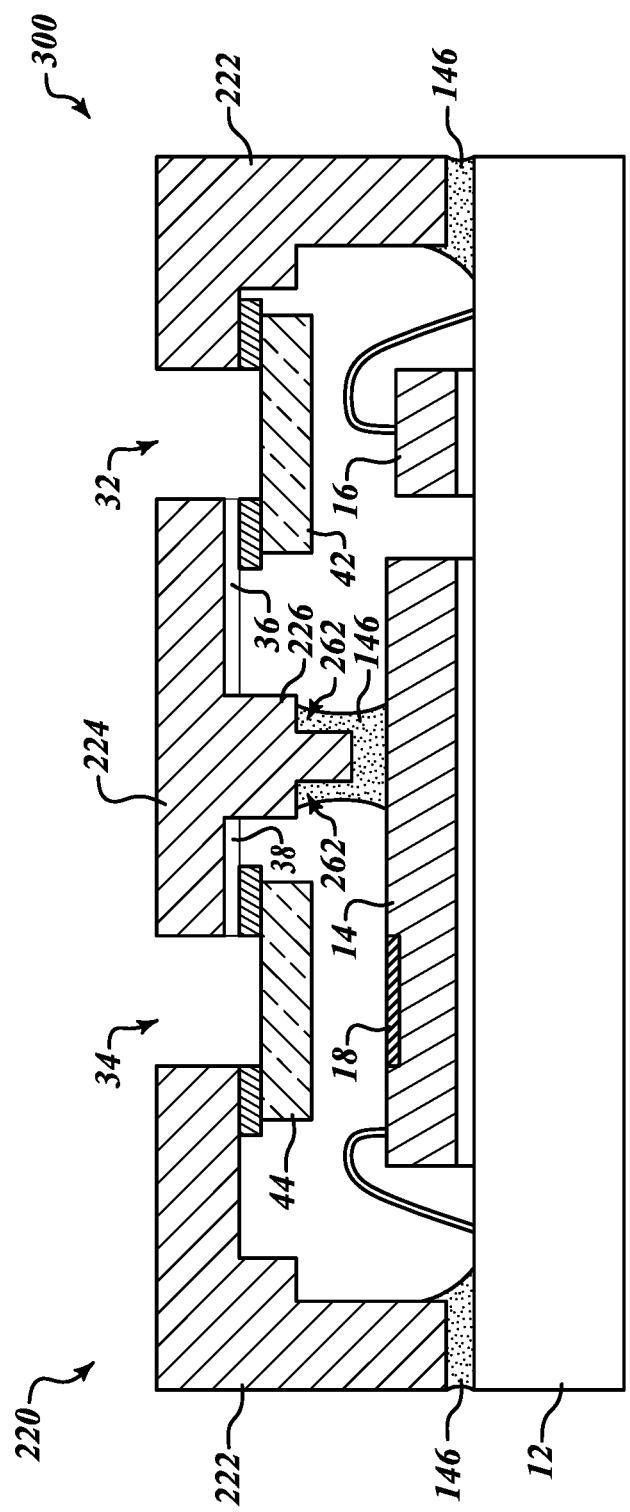
FIG. 4 is a cross-sectional view of an optical sensor package, in accordance with another embodiment of the present disclosure.

FIG. 4 is a cross-sectional view of an optical sensor package 300 including a cap 220, in accordance with one or more embodiments. The optical sensor package 300 of FIG. 4 is similar in structure and function to the optical sensor package 200 of FIGS. 2A and 2B, except for the differences that will be discussed below. The features shared by the optical sensor packages 200 and 300 will not be described here again in the interest of brevity.

One difference between the optical sensor package 200 shown in FIGS. 2A, 2B and the optical sensor package 300 shown in FIG. 4 is that the cap 220 of the optical sensor package 300 does not include a slot through an inner wall 226. Another difference is that the inner wall 226 of the cap 220 includes a stepped recess 262. In contrast to the inner wall 26 of the cap 20 shown in FIG. 1, which has a uniform profile and, thus, causes glue 46 to bleed up and over an outer surface of the inner wall 26 when the cap 20 is attached to the substrate 12, the stepped recess 262 of the inner wall 226 provides a volume on each side of the inner wall 226 for accommodating a flow of adhesive material 146 as the cap 220 is staged and cured (e.g., while the cap 220 is pressed onto adhesive material 146 applied to the substrate 12 and sensor die 14, and while the adhesive material 146 cures to securely attach the cap 220 to the substrate 12 and sensor die 14).

As shown in FIG. 4, the optical sensor package 300 may include first and second air vents 36, 38 between the first and second openings 32, 34 and the first and second transparent windows 42, 44, respectively. Additionally, the cap 220 may include a stepped extension at the junction of the sidewalls 222 and the cover 224, as shown.

Figure 5:
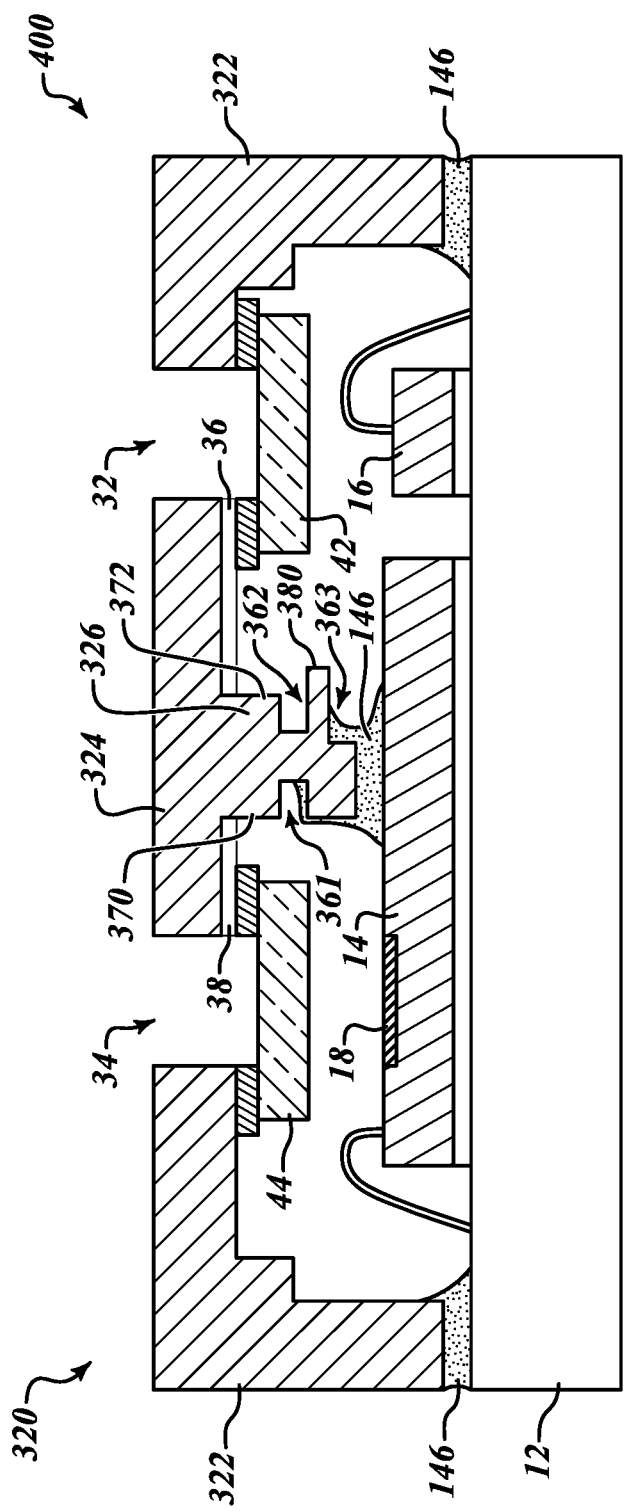
FIG. 5 is a cross-sectional view of an optical sensor package, in accordance with yet another embodiment of the present disclosure.

FIG. 5 is a cross-sectional view of an optical sensor package 400 including a cap 320, in accordance with one or more embodiments. The optical sensor package 400 of FIG. 5 is similar in structure and function to the optical sensor package 400 of FIG. 4, except for the differences that will be discussed below. The features shared by the optical sensor packages 300 and 400 will not be described here again in the interest of brevity.

The main difference between the optical sensor package 300 shown in FIG. 4 and the optical sensor package 400 shown in FIG. 5 is that the cap 320 of the optical sensor package 400 does not include a stepped recess, but instead includes recesses 361, 362, 363 formed in various portions of an inner wall 326 of the cap 320. The recesses 361, 362, 363 may be formed at a same level (i.e., at a same distance from either an upper or lower surface of the inner wall 326), or they may be staggered with respect to one another. For example, a first recess 361 may be formed extending into the inner wall 326 from a first side surface 370, while a second recess 362 may be formed extending into the inner wall 326 from a second side surface 372. The first and second recesses 361, 362 may be formed at a same level, as shown in FIG. 5. A third recess 363 may be formed at a different level along the inner wall 326 than the first and second recesses 361, 362. Further, the inner wall 326 may include one or more extensions 380. As shown in FIG. 5, the extension 380 may be a portion of the inner wall 326 that extends outwardly (e.g., horizontally with respect to the substantially vertical orientation of the inner wall 326, as shown) beyond the second side surface 372. The extension 380 includes first, second and third surfaces (e.g., upper, lower and side surfaces, as shown).

The recesses 361, 362, 363 formed in the inner wall 326 provide volumes at various heights along each side of the inner wall 326 for accommodating a flow of adhesive material 146 as the cap 320 is staged and cured. Moreover, the extension 380 formed in the inner wall 326 may provide an increased volume (i.e., in the second and third recesses 362, 363) for accommodating the flow of adhesive material 146, thereby holding the adhesive material 146 and preventing the adhesive material 146 from bleeding upward along the side surfaces of the inner wall 326 and blocking air vents or obscuring the openings 32, 34. Any number of recesses may be formed in the inner wall 326, and may be positioned anywhere along the inner wall 326. Further, one or more extensions 380 may be formed anywhere along the inner wall 326, extending outwardly to form recesses having an increased volume for holding a flow of adhesive material and preventing or otherwise containing bleeding of the adhesive material.

In one or more embodiments, the cap 320 may include a stepped extension at the junction of the sidewalls 322 and the cover 324, as shown in FIG. 5.

Optical sensor packages having any of the caps described herein (e.g., caps 120, 220, 320 of optical sensor packages 200, 300, 400, respectively) may be included in various electronic devices and may be coupled, for example, to a microprocessor, a power source, memory or other such electronic components. Electronic devices including the optical sensor packages described herein may include, for example, a cell phone, smartphone, tablet, camera, and/or wearable computing device that may be located in clothing, shoes, watches, glasses or any other wearable structures. In some embodiments, such an electronic device, or the optical sensor packages described herein, may be located in a vehicle, such as boat and car, a robot, or any other moveable structure or machinery.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An optical sensor package, comprising:
   a substrate;
   a sensor die coupled to the substrate;
   a light-emitting device coupled to the substrate; and
   a cap positioned around side surfaces of the sensor die and covering at least a portion of the substrate, the cap including:
      first and second sidewalls,
      an inner wall having first and second side surfaces and a mounting surface, the first and second side surfaces being transverse to the mounting surface, the inner wall including an opening extending into the inner wall from the mounting surface, and
      a cover in contact with the first and second sidewalls and the inner wall; and
   a first adhesive material on the sensor die and at least partially within the opening, the first adhesive material securing the inner wall to the sensor die.

2. The optical sensor package of claim 1, wherein the opening includes a slot extending from the mounting surface of the inner wall through the inner wall and through the cover.

3. The optical sensor package of claim 1, wherein the opening includes a first recess extending into the inner wall from the mounting surface and from the first side surface of the inner wall.

4. The optical sensor package of claim 3, further comprising a second recess extending into the inner wall from the mounting surface and from the second side surface of the inner wall, the first adhesive material being at least partially within the second recess.

5. The optical sensor package of claim 1, the inner wall including an extension that extends outwardly beyond the second side surface, wherein the opening includes a first recess extending into the inner wall from the mounting surface and abutting a first surface of the extension.

6. The optical sensor package of claim 5, further comprising a second recess extending into the inner wall from the second side surface of the inner wall and abutting a second surface of the extension.

7. The optical sensor package of claim 6, further comprising a third recess extending into the inner wall from the first side surface of the inner wall.

8. The optical sensor package of claim 1, wherein the light-emitting device comprises at least one of a vertical cavity surface emitting laser (VCSEL) and a light-emitting diode (LED).

9. The optical sensor package of claim 1, further comprising:
a second adhesive material positioned between the first sidewall of the cap and the substrate; and
a third adhesive material positioned between the second sidewall of the cap and the substrate, the second and third adhesive materials securing the first and second sidewalls, respectively, to the substrate.

10. The optical sensor package of claim 9, wherein the first, second and third adhesives include glue.

11. A cap for an optical sensor package, comprising:
first and second sidewalls;
an inner wall; and
a cover in contact with and extending between the first and second sidewalls and the inner wall, the inner wall including an opening extending into the inner wall from a first surface of the inner wall, the opening being configured to accommodate an adhesive material.

12. The cap of claim 11, wherein the opening includes a slot extending into the inner wall from the first surface of the inner wall.

13. The cap of claim 12, wherein the slot extends through the inner wall and through the cover.

14. The cap of claim 11, wherein the inner wall includes first and second side surfaces that are transverse to the first surface, and an extension that extends outwardly beyond the second side surface, wherein the opening includes a first recess extending into the inner wall from the first surface of the inner wall and abutting a first surface of the extension.

15. The cap of claim 14, wherein the inner wall further includes a second recess extending into the inner wall from the first side surface of the inner wall.

16. A cap for an optical sensor package, comprising:
first and second sidewalls;
an inner wall; and
a cover in contact with the first and second sidewalls and the inner wall, the inner wall including an opening extending into the inner wall from a first surface of the inner wall, the opening being configured to accommodate an adhesive material, wherein the opening includes a first recess extending into the inner wall from the first surface of the inner wall and from a first side surface of the inner wall, the first side surface being transverse to the first surface.

17. The cap of claim 16, wherein the inner wall further includes a second recess extending into the inner wall from the first surface of the inner wall and from a second side surface of the inner wall, the second side surface being opposite the first side surface and transverse to the first surface.

18. A method, comprising:
forming a cap for an optical sensor package, the cap including first and second sidewalls, an inner wall and a cover in contact with the first and second sidewalls and the inner wall, the inner wall having first and second side surfaces and a mounting surface, the first and second side surfaces being transverse to the mounting surface, the inner wall including an opening extending into the inner wall from the mounting surface;
positioning the first and second sidewalls of the cap on a substrate;
positioning the mounting surface of the inner wall of the cap on a sensor die coupled to the substrate; and
providing a first adhesive material on the sensor die and at least partially within the opening in the inner wall of the cap, the first adhesive material securing the inner wall to the sensor die.

19. The method of claim 18, wherein the opening includes a slot extending from the mounting surface of the inner wall through the inner wall and through the cover, and providing the first adhesive material includes providing the first adhesive material through the slot and onto the sensor die.

20. The method of claim 18, wherein the opening includes a first recess extending into the inner wall from the mounting surface and from the first side surface of the inner wall.

21. The method of claim 20, wherein the inner wall includes a second recess extending into the inner wall from the mounting surface and from the second side surface of the inner wall, and providing the first adhesive material includes providing the first adhesive material at least partially within the second recess.

22. The method of claim 18, wherein the inner wall includes an extension that extends outwardly beyond the second side surface, and the opening includes a first recess extending into the inner wall from the mounting surface and abutting a first surface of the extension.

23. The method of claim 18, further comprising:
providing a second adhesive material between the first sidewall of the cap and the substrate; and
providing a third adhesive material between the second sidewall of the cap and the substrate, the second and third adhesive materials securing the first and second sidewalls, respectively, to the substrate.

* * * * *